US012599937B2

(12) United States Patent
    Yan et al.

(10) Patent No.: US 12,599,937 B2
(45) Date of Patent: Apr. 14, 2026

(54) WATER-BASED, HIGH-EFFICIENCY CHEMICAL REAGENT FOR SUBSTRATE SURFACE PARTICLE REMOVAL

(71) Applicant: Applied Materials, Inc., Santa Clara, CA (US)

(72) Inventors: Hong Yan, Singapore (SG); Raymond Hoiman Hung, Palo Alto, CA (US); Ying Wang, Singapore (SG); Xundong Dai, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/420,408

(22) Filed: Jan. 23, 2024

(65) Prior Publication Data

US 2025/0235900 A1     Jul. 24, 2025

(51) Int. Cl.
    *B08B 3/08*        (2006.01)
    *B08B 3/04*        (2006.01)
    *B08B 3/12*        (2006.01)
    *H01L 21/02*       (2006.01)

(52) U.S. Cl.
    CPC ................ *B08B 3/08* (2013.01); *B08B 3/041* (2013.01); *B08B 3/123* (2013.01); *H01L 21/02065* (2013.01); *H01L 21/02074* (2013.01)

(58) Field of Classification Search
    None
    See application file for complete search history.

(56) References Cited

U.S. PATENT DOCUMENTS

| | | | |
|---|---|---|---|
| 5,964,954 A | 10/1999 | Matsukawa et al. | |
| 10,229,842 B2 | 3/2019 | Sakata et al. | |
| 2011/0031326 A1* | 2/2011 | Sato ................. | H01L 21/02057 |
| | | | 239/102.2 |
| 2013/0220368 A1 | 8/2013 | Ishibashi | |
| 2021/0098271 A1* | 4/2021 | Kamimura ........ | H01L 21/67028 |
| 2021/0301221 A1* | 9/2021 | Ke ........................ | C11D 3/2086 |
| 2022/0135916 A1* | 5/2022 | Hirano ..................... | C11D 1/22 |
| | | | 510/175 |
| 2022/0139723 A1 | 5/2022 | Sun et al. | |
| 2023/0203409 A1 | 6/2023 | Wada et al. | |

FOREIGN PATENT DOCUMENTS

| | | | | | |
|---|---|---|---|---|---|
| CN | 109656034 A | * | 4/2019 | ....... | H01L 21/67057 |
| KR | 20060010236 A | * | 2/2006 | | |
| WO | WO-2004037962 A2 | * | 5/2004 | ............. | C11D 1/00 |
| WO | WO-2008085258 A1 | * | 7/2008 | ............. | B08B 3/12 |

OTHER PUBLICATIONS

Google Patents translation of KR20060010236A (Year: 2025).*
PE2E translation of CN 109656034 (Year: 2025).*
International Search Report, PCT/US2024/061723, dtd Apr. 16, 2025, 9 pages.

* cited by examiner

*Primary Examiner* — Eric W Golightly
(74) *Attorney, Agent, or Firm* — Patterson + Sheridan, LLP

(57)         ABSTRACT

Embodiments of the disclosure provided herein include systems and methods for cleaning semiconductor substrates The method includes rotating a substrate disposed on a substrate support, spraying a front side of the substrate using a cleaning agent including one or more chelating agents through a front side nozzle assembly disposed above the substrate support, and spraying a back side of the substrate using the cleaning agent through a back side dispenser assembly disposed below the substrate support.

27 Claims, 3 Drawing Sheets

WATER-BASED, HIGH-EFFICIENCY CHEMICAL REAGENT FOR SUBSTRATE SURFACE PARTICLE REMOVAL

BACKGROUND

Field

Embodiments of the present disclosure generally relate to semiconductor substrate processing, and more specifically to semiconductor substrate processing tools and methods thereof.

Description of the Related Art

In semiconductor manufacturing processes, including chemical mechanical polishing (CMP), singulation processes, bonding, and lithography, comprehensive removal of undesired particles from substrate surfaces is essential following each step of semiconductor fabrication. For example, singulation processes, where a substrate dicing technique is used to cut each die such as with a diamond blade, laser, or plasma into individual chips, may produce undesired particles and debris on the substrate surface.

Insufficiently cleaned substrate surfaces directly jeopardize the success of subsequent chip-to-substrate bonding in semiconductor fabrication. Contaminants and residual particles act as physical barriers, hindering proper adhesive contact and leading to weak bonds. These weak bonds lead to reduced structural integrity where the bonded structure becomes susceptible to mechanical stress, thermal cycling, and vibration, escalating the risk of device failure or performance degradation. Further, conductive contaminants, such as ionic impurities, create pathways for current leakage between the bonded substrates, disrupting signal integrity, increasing power consumption, and potentially damaging sensitive circuitry. Additionally, the presence of contaminants can instigate the formation of defects like dislocations, cracks, and pinholes, acting as potential failure sites and significantly impacting yield and reliability.

Thus, there is a need for a method and apparatus capable of cleaning substrates at various stages of processing that is efficient and can effectively remove a wide range of contaminant particles.

SUMMARY

Embodiments described herein generally relate to systems and methods used for semiconductor substrate processing and, more particularly, to systems and methods for cleaning semiconductor substrates after chemical mechanical polishing (CMP) processes.

In an embodiment, a method of cleaning a substrate is provided. The method includes rotating a substrate disposed on a substrate support, spraying a front side of the substrate using a cleaning agent through a front side nozzle assembly, and spraying a back side of the substrate using the cleaning agent through a back side dispenser assembly. The cleaning agent includes one or more chelating agents.

In another embodiment, a method of cleaning a substrate is provided. The method includes rotating a substrate support, and spraying a front side of the substrate from above the substrate using a cleaning agent including one or more chelating agents through a front side nozzle assembly.

In yet another embodiment, a method of cleaning a substrate is provided. The method includes rotating a substrate disposed on a substrate support, spraying a front side of the substrate using a cleaning agent including one or more chelating agents through a front side nozzle assembly disposed above the substrate support, and spraying a back side of the substrate using the cleaning agent through a back side dispenser assembly disposed below the substrate support.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of the present disclosure and are therefore not to be considered limiting of its scope, and the present disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments herein are generally directed to semiconductor substrate processing and, more particularly, to systems and methods for cleaning semiconductor substrates after chemical mechanical polishing (CMP) processes.

An integrated circuit is typically formed on a substrate by the sequential deposition of conductive, semiconductive, or insulative layers on a substrate. Semiconductor fabrication includes numerous processes in which the surface of the substrate is cleaned at various stages before the formation of devices can be completed. Removing particles from substrate surfaces after chemical mechanical polishing (CMP) processing presents challenges, particularly due to the wide variety of contaminant particles found on substrate surfaces post-CMP polishing. One common method for cleaning the substrates involves de-ionized (DI) water cleaning, such as a rinsing the substrate with DI water at various temperatures to remove contaminant particles left on the surface of a substrate. Conventional methods like DI water cleaning exhibit limited effectiveness, yielding lower particle removal rates such as about a 50% removal rate. These approaches often struggle with addressing a wide range of particles, both dielectric and metallic particles, as well as residual materials, resulting in unsatisfactory cleaning results. Further, the process can inadvertently impact delicate substrate structures. To ensure dependable chip-to-substrate bonding, there is a need for more efficient and adaptable solutions in particle removal.

The present disclosure provides a chemical solution to the challenge of substrate surface particle removal. By combining effective solvents and chelating agents, the method efficiently addresses both dielectric and metallic particles, as well as residual materials. This approach, formulated in a specific ratio with DI water, achieves a particle removal rate of 98% or higher, surpassing the limitations of traditional DI water cleaning methods.

Figure 1:
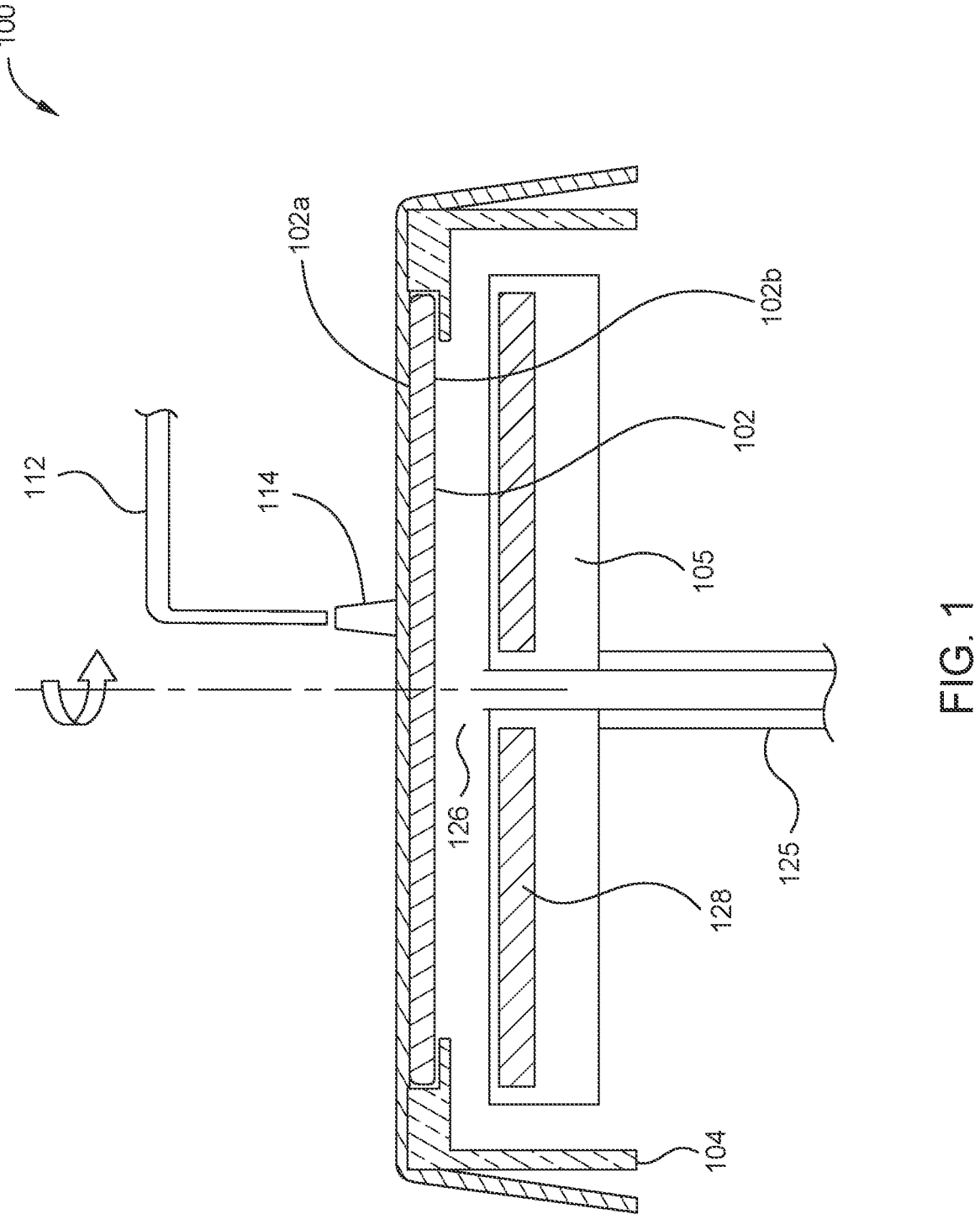
FIG. 1 is a cross-sectional schematic view of a substrate processing apparatus, including a substrate support, a back plate, and a dispense assembly according to an embodiment.

FIG. 1 depicts a cross-sectional schematic view of a substrate processing apparatus 100, including a substrate support 104 and a back plate 105. The substrate support 104 is capable of spinning as further described herein. The back plate 105 is vertically movable or is fixed.

A front side nozzle assembly 112 is disposed over the substrate support 104 and configured to be disposed over a substrate 102 disposed on the substrate support 104 (e.g., off-center from the center of the substrate). The front side nozzle assembly 112 is capable of spraying a cleaning agent over the front side 102a of the substrate 102 with a jet stream 114. In some embodiments, the front side nozzle assembly 112 releases the cleaning agent to rinse the front side 102a of the substrate 102. In operation, the substrate 102 rotates at about 10 rpm to about 1000 rpm, such as about 500 rpm to about 900 rpm. The front side nozzle assembly 112 is capable of moving along a planar axis above the substrate 102 in a direction between a center of the substrate and an edge of the substrate 102. The front side nozzle assembly 112 is capable of dispensing the cleaning agent at a rinse flow rate of about 800 ml/min to about 3000 ml/min for megasonic cleaning, rinse flow rate of about 30 ml/min to about 40 ml/min for droplet jet cleaning.

In some embodiments, the cleaning agent from the cleaning source is a solution of organic solvents, chelating agents, non-oxidizing acid, surfactant, and water. The cleaning agent may include one or more chelating agents, such as benzotriazole, tolyltriazole, 5-phenyl-benzotriazole, 5-nitro-benzotriazole, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1, 2,3-triazole, 3-amino-1,2,4-triazole, 3-mercapto-1,2,4-triazole, 3-isopropyl-1,2,4-triazole, 5-phenylthiol-benzotriazole, halo-benzotriazoles, naphthotriazole, 2-mercaptobenzoimidizole, 2-mercaptobenzothiazole, 4-methyl-2-phenylimidazole, 2-mercaptothiazoline, 5-aminotetrazole, 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, mercaptobenzothiazole, imidazoline thione, mercaptobenzimidazole, 4-methyl-4H-1,2,4-triazole-3-thiol, 5-amino-1,3, 4-thiadiazole-2-thiol, benzothiazole, tritolyl phosphate, indiazole, guanine, adenine, glycerol, thioglycerol, nitrilotriacetic acid, salicylamide, iminodiacetic acid, benzoguanamine, melamine, thiocyranuric acid, anthranilic acid, tartaric acid, gallic acid, ascorbic acid, salicylic acid, 8-hydroxyquinoline, 5-carboxylic acid-benzotriazole, 3-mercaptopropanol, boric acid, iminodiacetic acid, phenolic, carboxylic acid, phosphonic acid, thiocarbamate, ethylenediaminetetraacetic acid, N,N'-bis(2-hydroxyphenyl)ethylenediiminodiacetic acid, 1-hydroxyethane, 1,1 diphosphonic acid, triethylenetetranittrilohexaacetic acid, Mannich base, iminodiacetic acid and their derivatives or salts or combination thereof. In one embodiment, chelating agents that are water-soluble and possess the ability to bond with both a fresh copper surface and/or a copper oxide film are used. This bonding capability enables them to passivate or safeguard the copper-containing layer effectively.

During fabrication processes, the substrate surface may be impacted by the deposition of metal ions, altering device properties. These metals when exposed to chelating agents, bond to the chelating agents with specific affinities and are pulled away from the substrate surface and removed from the cleaning solution.

Chelating agents are not limited to the removal of a singular type of metal ion and can bind to a broad range of metals, such as transition metals and trace elements commonly encountered in substrate processing. The use of chelating agents in the cleaning agent enable thorough cleaning through broad spectrum coverage.

Further, unlike harsher cleaning methods, chelation is effective without causing damage to the fragile structures on the surface of substrate. The risk of etching or unwanted reactions is reduced by the targeted binding nature of chelation. Chelating agents may further include specific functional groups to enhance binding to particular metal ions, offering high selectivity and reducing the likelihood of accidentally removing desired elements.

The cleaning agent also includes an organic solvent that is water soluble, such as dimethyl sulfoxide (DMSO), dimethylacetamide (DMAc), n-methyl-2-pyrrolidone (NMP), butyldiglycol, or a combination thereof. The organic solvent is included to effectively break down and dissolve complex organic particles, such as carbon elements. Organic solvents enhance chelation depending upon the specific solvent and chelating agent in use. Organic solvents have the ability to dissolve both the chelating agent and metal ions, often surpassing the solubility achieved in water. This heightened solubility brings the chelating agent and metal ions into closer proximity, fostering more frequent collisions and elevating the reaction rate of chelation.

Further, distinct organic solvents exhibit varying polarities and affinities for specific functional groups, providing a means for precise control over the selectivity of the chelation process. This promotes the complexation between particular metal ions and the chelating agents.

In aqueous solutions, metal ions are commonly enveloped by water molecules forming hydration spheres. Certain organic solvents, characterized by lower dielectric constants compared to water, are less effective at stabilizing these hydration spheres, allowing the displacement by the chelating agent and subsequent complex formation with the metal ions. Additionally, organic solvents can interact with the functional groups of the chelating agent, influencing their charge and polarity. This interaction has the potential to modify the strength and selectivity of the metal-ligand bond, thereby enhancing the stability of the resultant complex.

Moreover, specific organic solvents can engage in interactions with either the metal ion or the chelating agent, further aiding in complex formation. These interactions may encompass hydrogen bonding, $\pi$-$\pi$ interactions, or direct coordination with the metal center, thereby contributing to the overall efficacy of the chelation process. A range of non-oxidizing acids—HF, HCl, H2SO4, HBF4, H3PO4, acetic acid, hydroxyacetic acid, and citric acid—are employed. These solutions can be pH-buffered using standard buffering agents like citric acid, acetic acid, various amines (primary, secondary, tertiary), trishydroxylethyl ammonium hydroxide, tetramethyl lammonium hydroxide, choline, trischoline, and their associated salts to maintain the desired pH level. Typically, the pH values of these cleaning solutions span from 1 to 12.

The cleaning agent may include an organic alkaline, such as ethanolamine. Organic alkalines are included in the cleaning agent to influence chelation. By elevating the pH of the solution, organic alkalines have the potential to deprotonate certain functional groups on the chelating agent. This deprotonation augments the negative charge on these groups, heightening their attractiveness to positively charged metal ions and fortifying the metal-ligand bond. Organic alkalines can also dissolve both the chelating agent and metal ions, thereby increasing the likelihood of their interaction and facilitating chelation. Some organic alkalines share similarities with organic solvents, possessing lower dielectric constants that diminish the interactions between metal ions and their hydration spheres. This diminished interaction renders the metal ion more accessible for complexation with the chelating agent. In certain instances, organic alkalines themselves can form complexes with metal ions. These mixed complexes may subsequently engage with the chelating agent, resulting in the formation of a ternary complex characterized by enhanced stability and selectivity.

In one embodiment disclosed herein, the treatment liquid features the incorporation of organic alkaline compounds, aimed at enhancing resist removability and reducing process defects. Specifically, these compounds, encompassing quaternary ammonium salts, alkanolamines, alkylhydroxylamines, and their corresponding salts, exhibit alkaline properties within an organic structure.

For improved resist removability and defect reduction, quaternary ammonium salts and alkanolamines may be used. Notably, quaternary ammonium salts also serve the dual function of adjusting pH levels. Examples of organic alkaline compounds include tetramethylammonium hydroxide, tetraethylammonium hydroxide, tetrapropylammonium hydroxide, tetrabutylammonium hydroxide, ethyltrimethylammonium hydroxide, trimethylhydroxyethylammonium hydroxide, methyltri (hydroxyethyl) ammonium hydroxide, tetra (hydroxyethyl) ammonium hydroxide, benzyltrimethylammonium hydroxide, tetrapentylammonium hydroxide, tetrahexylammonium hydroxide, tetraoctylammonium hydroxide, butyltrimethylammonium hydroxide, Methyltriamylammonium hydroxide, dibutyldipentylammonium hydroxide, triethylphenylammonium hydroxide, trimethylbenzylammonium hydroxide, triethylbenzylammonium hydroxide, tribenzylmethylammonium hydroxide, tetrabenzylammonium hydroxide, trimethylcyclohexyl ammonium hydroxide Tributylcyclohexylammonium hydroxide, monohydroxyethyltrimethylammonium hydroxide, dihydroxyethyldimethylammonium hydroxide (dimethylbis (2-hydroxyethyl) ammonium hydroxide), trihydroxyethyl monomethylammonium hydroxide, monohydroxyethyltriethylammonium hydroxide, Ammonium acetate, Dihydroxyethyl diethylammonium hydroxide, trihydroxyethyl monoethylammonium hydroxide, monohydroxypropyltrimethylammonium hydroxide, dihydroxypropyldimethylammonium hydroxide, trihydroxypropylmonomethylammonium hydroxide, ethyltrimethylammonium hydroxide, trimethyladamantylammonium hydroxide, tetramethylpiperidinium, methyltributylammonium chloride, tetrabutylammonium bromide, tetraethylammonium bromide, tetraethylammonium chloride, 2-Dimethylaminoethanol, 2-(Methylamino)ethanol, Ethanolamine, Amino-2-propanol, Triethylamine, tetramethylammonium chloride, monohydroxypropyltriethylammonium hydroxide, dihydroxypropyldiethyl, colin hydroxide dimethylbis (2-hydroxyethyl) ammonium hydroxide, ethyltrimethylammonium hydroxide, monoethanolamine, 2-amino-2-ethoxy-ethanol examples include ammonium hydroxide, trihydroxypropyl monoethylammonium hydroxide, and choline (e.g., choline hydroxide). The quaternary ammonium salt may be used alone or in combination of two or more.

The cleaning agent may also be diluted in a solvent, such as water. Water as a solvent in the cleaning agent activates the one or more chelating agents on inorganic ions, particularly metal particles or metal ions, causing them to detach from the substrate surface. Water dissolves both the chelating agent and the metal ions, thereby enhancing the likelihood of their interaction and the formation of a complex. In the absence of sufficient solubility, the reaction rate between the chelating agent and the metal ion would be considerably slower. Water molecules can form hydration spheres around metal ions, and these spheres may be displaced by the chelating agent's ligand groups, allowing direct binding to the metal ion. In certain instances, the hydration sphere weakens the attraction between the metal ion and its surrounding anions, facilitating the chelating agent's competition and the subsequent formation of a complex. Additionally, the interaction between water and the functional groups of the chelating agent can alter their charge and polarity, impacting the strength and selectivity of the metal-ligand bond. For example, water may protonate certain ligand groups, rendering them more positively charged and potentially increasing their affinity for specific metal ions. Notably, some chelating agents necessitate proton transfer reactions for the formation of stable complexes with metal ions, and water plays a pivotal role in this process by serving as a proton donor or acceptor, thereby activating the chelating agent.

The surfactant functions physically and is preferable for effectively peeling and removing impurities adhered to the substrate surface. The specific amount of surfactant isn't strictly defined, but for enhanced deposit peelability, a range of about 0.0001% to about 10% by mass concerning each agent is preferable, such as about 0.001% to about 1% by mass.

While the surfactant choice is not strictly limited, various categories like cationic, anionic, amphoteric, or nonionic surfactants are illustrated. Notably, nonionic or anionic surfactants may be used due to their exceptional adhesion-peeling performance and their ability to prevent reattachment of removed impurities to the substrate surface.

Cationic surfactants encompass tetraalkylammonium salts, alkylamine salts, benzalkonium salts, alkylpyridium salts, imidazolium salts, and similar compounds.

Anionic surfactants include sodium dodecylbenzenesulfonate, sodium lauryl sulfate, sodium alkyldiphenyl ether disulfonate, sodium alkylnaphthalenesulfonate, among others.

Amphoteric surfactants such as carboxybetaine, sulfobetaine, aminocarboxylate, and imidazoline derivatives are also outlined.

Nonionic surfactants cover a diverse range, including polyoxyethylene alkyl ether, polyoxyethylene alkylphenyl ether, polyoxyethylene fatty acid ester, sorbitan fatty acid ester, polyoxyethylene sorbitan fatty acid ester, and compounds with oxyethylene or oxypropylene structures.

Polyoxyalkylene-type nonionic surfactants, especially those featuring ethylene or propylene as their alkylene component, exhibit exceptional adhesion-peeling performance. Specific examples include polyoxyalkylene alkyl ether, polyoxyalkylene alkylphenyl ether, polyoxyalkylene glycol fatty acid ester, polyoxyalkylene fatty acid ester, polyoxyalkylene sorbitan fatty acid ester, polyoxyalkylene fatty acid monoalkanolamide, and polyoxyalkylene fatty acid dialkanolamide.

Still referring to FIG. 1, a back side dispenser assembly 126 is disposed below the substrate 102 (e.g., centered below the substrate) and is capable of injecting the cleaning agent over the back side 102b of the substrate 102. The cleaning agent is injected through a channel 125 of the back side dispenser assembly 126 that runs through a central portion of the back plate 105. In some embodiments, the back side dispenser assembly 126 releases the cleaning agent to rinse the back side 102*b* of the substrate 102. In operation, the cleaning agent fluid from the back side dispenser assembly 126 is directed to a center of the back side 102*b* of the substrate 102 while the substrate 102 is spinning. In some embodiments, which can be combined with other embodiments described herein, the cleaning agent is dispensed from the back side dispenser assembly 126 through a single center orifice.

Optionally, one or more piezoelectric transducers 128 may be embedded in the back plate 105 to form a megasonic plate. The megasonic plate is capable of applying megasonic energy to the fluid provided by the back side dispenser assembly 126. In operation, the megasonic energy is coupled from the back side 102*b* to the front side 102*a* of the substrate 102 for agitation. The megasonic plate provides agitation, which, in combination with the cleaning process described herein dissociates residues and contaminants from substrates 102. In some embodiments, which can be combined with other embodiments described herein, the megasonic energy is applied to fluid between the back plate 105 and back side 102*b* of the substrate 102 after exiting the back side dispenser assembly 126, as shown in FIG. 1.

Figure 2:
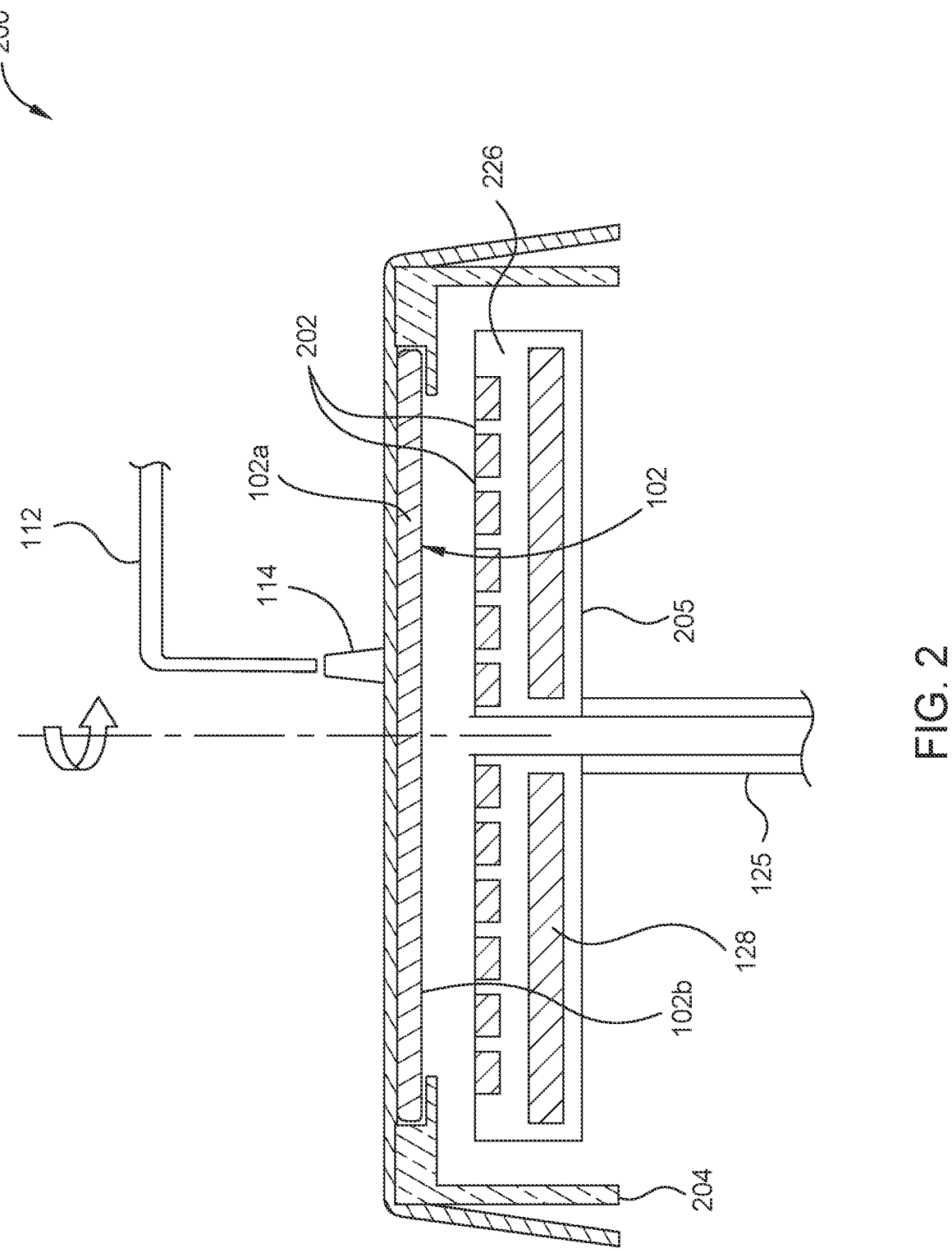
FIG. 2 is a cross-sectional schematic view of a substrate processing apparatus having a plurality of apertures on a back plate according to an embodiment.

FIG. 2 is a cross-sectional schematic view of a substrate processing apparatus 200 having a back side dispenser assembly 226 having a plurality of apertures 202 on a back plate 205 of the substrate processing apparatus. In operation, fluid is injected through channel 125 of the back side dispenser assembly 126 and is directed through the plurality of apertures 202 on the back plate 205 to the back side 102*b* of the substrate 102. One or more piezoelectric transducers 128 can also be used in combination with the plurality of apertures 202. In some embodiments, which can be combined with other embodiments described herein, megasonic energy is applied to fluid within the back side dispenser assembly 226 before exiting the back side dispenser assembly 226, as shown in FIG. 2. Alternatively, or additionally, megasonic energy is applied to fluid on the front side of the substrate.

Figure 3:
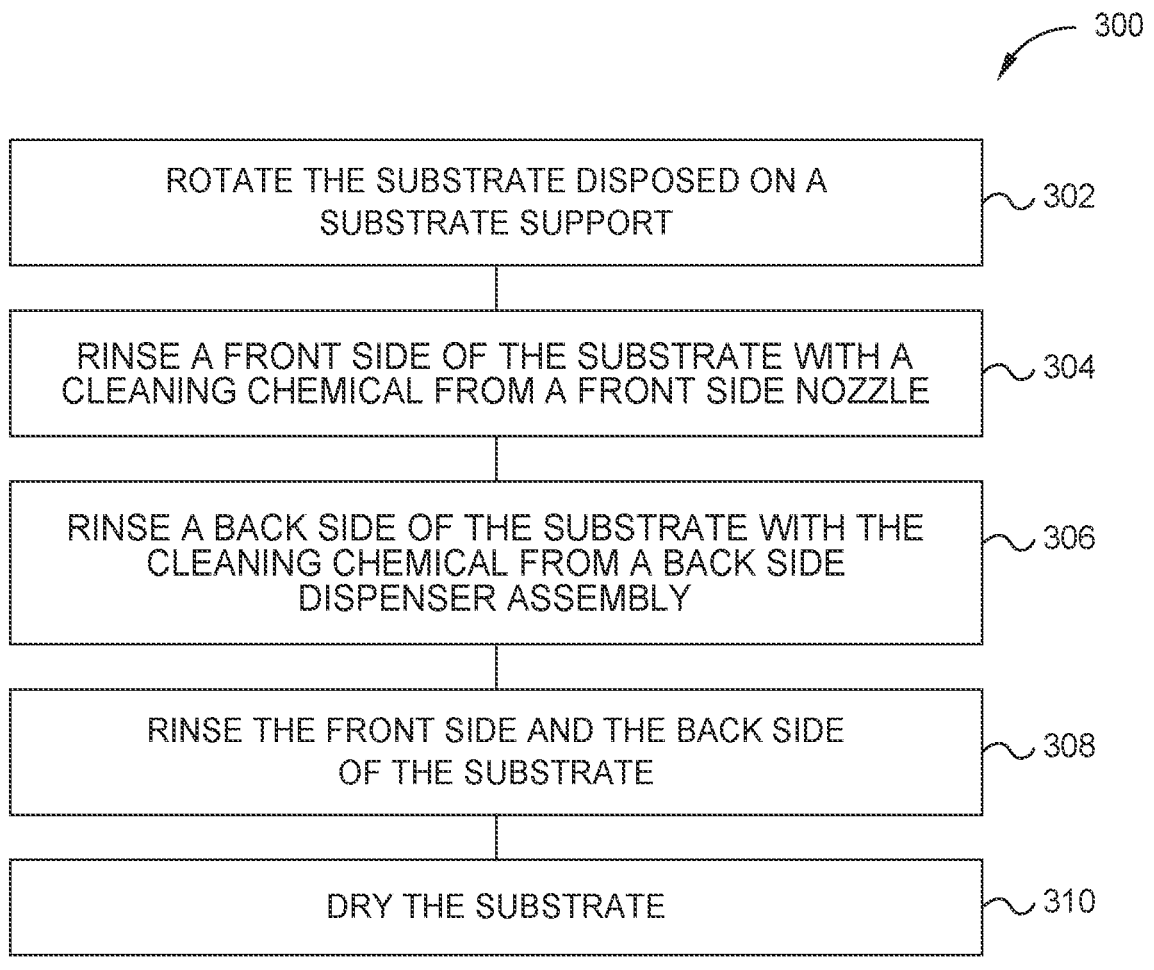
FIG. 3 is a process flow diagram of a method for processing a substrate according to an embodiment.

FIG. 3 is a process flow diagram of a method 300 for processing a substrate 102 according to an embodiment. In operation 302, a substrate 102 disposed on a substrate support 204 is rotated. The substrate 102 is positioned on a single substrate spin station as shown in FIG. 1 and FIG. 2. While the substrate is rotated, a front side 102*a* of the substrate 102 is rinsed with the cleaning agent from a front side nozzle assembly 112 in operation 304. Alternatively, or additionally, a back side 102*b* of the substrate 102 is rinsed with the cleaning agent from a back side dispenser assembly 126 in operation 306. In some embodiments, operation 304 occurs prior to operation 306, operations 304 and 306 occur simultaneously relative to one another, and/or operation 306 occurs prior to operation 304.

The back side dispenser assembly 126 and the front side nozzle assembly 112 rinse the substrate 102 with the cleaning agent during processing. In some embodiments, the front side nozzle assembly 112 and the back side dispenser assembly 126 each include multiple nozzles capable of dispensing the cleaning agent simultaneously. During rinsing, the cleaning agent is dispensed simultaneously through the front side nozzle assembly 112 and the back side dispenser assembly 126.

The use of the cleaning agent as described improves the particle removal rate over DI water rinse alone and may be used effectively at room temperature, reducing the need to heat the substrate and maintain an elevated temperature for cleaning. In particular, the use of chelating agents, activated using a water solvent, improves removal of both dielectric and metallic particles as well as residual materials, resulting in improved substrate cleaning. Specifically, the cleaning agent rinse results in particle removal rates of 90% or higher, such as 98%, which is a drastic improvement over DI water particle removal rates of only 50%.

Mechanical energy may be used to enhance the kinetic force of the cleaning agent on the wafer surface, which can significantly elevate the effectiveness of the cleaning process. Optionally, acoustic cavitation, such as from megasonic energy, may be applied from the back plate 105 or an acoustic source generator may be coupled to one or more nozzles to provide agitation to the cleaning agents for residue and particle removal. Acoustic cavitation includes ultrasonically or megasonically energizing the fluid to dislodge residue and debris. Acoustically energizing fluid may include using a piezoelectric transducer (PZT) operating in a frequency range from a lower ultrasonic range (e.g., about 20 KHz) to an upper megasonic range (e.g., about 2 MHz). Other frequency ranges can be used. The shape of a suitable acoustic energy source generator (e.g., a PZT) is rectangular.

Additionally or alternatively, droplet jet cleaning harnesses the kinetic energy generated by small droplets to improve the removal of contaminants and particles from the substrate surface. By integrating mechanical energy, a more thorough and efficient cleaning process may be accomplished, which enhances the overall cleanliness and quality of the semiconductor devices produced.

In contrast to the traditional method of brush scrubbing, which relies on direct contact between the brush and the substrate surface, droplet jet cleaning employs high-velocity streams of minuscule liquid droplets for the removal of contaminants and particles. Ranging in size from 5 to 50 micrometers, these droplets are directed at the substrate surface using nozzles or other delivery systems.

A pressurized cleaning solution is pumped through a microfluidic system, generating a fine mist of droplets. The droplets are focused and directed toward the substrate surface by a precisely aligned array of nozzles, allowing control over droplet size, velocity, and spray angle. Upon contact with the substrate surface, the droplets exert a localized cleaning force, effectively dislodging and removing contaminants. The high velocity and small size of the droplets reduce the risk of scratching or damaging the delicate substrate surface. Following the cleaning process, the substrate undergoes rinsing with ultrapure water to eliminate any residual cleaning solution, followed by drying using a nitrogen blow dryer or other drying techniques.

The non-contact nature of droplet jet cleaning significantly reduces the risk of scratches and other surface defects, making it particularly suitable for cleaning advanced and delicate substrate materials. The targeted nature of the droplet jets enables precise removal of contaminants from specific areas of the substrate, proving beneficial for challenging geometries and deep trenches. In comparison to brush scrubbing, droplet jet cleaning often requires less cleaning solution, contributing to enhanced environmental sustainability and reduced waste generation. The ability to finely tune droplet size, velocity, and spray angle provides precise control over the cleaning process, yielding enhanced results.

In operation 308, the front side 102*a* and the back side 102*b* of the substrate 102 is rinsed using DI water supplied from the front side nozzle assembly 112 and the back side dispenser assembly 126. In some embodiments, the front side nozzle assembly 112 and the back side dispenser assembly 126 each include multiple nozzles capable of dispensing DI water simultaneously. During rinsing, DI water is dispensed through the front side nozzle assembly 112 and the back side dispenser assembly 126. Rinsing the substrate rinses away any dislodged residue and debris. The substrate continues to rotate during all operations described herein.

Operations 302 to 308 are used at or between each stage of processing the substrate 102, such as front-end-of-line (FEOL) cleaning. For back-end-of-line (BEOL) processing, nitrogen is used to atomize the cleaning agent in operation 310. In particular, BEOL processing occurs after polishing the substrate in CMP processing.

In operation 310, the substrate 102 is dried. In some embodiments, the substrate is dried in less than 30 seconds. Drying the substrate 102 includes drying by pulling fluids away from the surfaces of the substrate 102 using a surface tension gradient formed at the mixing front between a low surface tension fluid, such as isopropyl alcohol (IPA), and a high surface tension water. The surface tension can be reduced using an IPA spray or vapor, or any suitable spray or vapor that reduces surface tension of water that is dissolved therein. In some embodiments, the IPA is heated up to further reduce the surface tension of the IPA prior to applying to the substrate. In some embodiments, IPA is mixed with nitrogen to provide an IPA vapor and $N_2$ mixture to be dispensed over the substrate. Additionally, the drying process used herein quickly vaporizes the thin IPA film that has replaced water film over the substrate using a low rotation rate of about 300 rpm to about 500 rpm, and thus dries the cleaned substrate.

The present disclosure provides a method of cleaning a substrate after CMP processes, singulation processes, or other semiconductor processes that includes the use of a chelating agents in a cleaning agent. By combining effective solvents and chelating agents, the method effectively removes both dielectric and metallic particles, as well as residual materials, from substrate surfaces. This approach, formulated in a specific ratio with DI water, achieves a particle removal rate of 98% or higher, surpassing the limitations of traditional DI water cleaning methods.

When introducing elements of the present disclosure or exemplary aspects or embodiments thereof, the articles "a," "an," "the" and "said" are intended to mean that there are one or more of the elements.

The terms "comprising," "including" and "having" are intended to be inclusive and mean that there may be additional elements other than the listed elements.

The term "coupled" is used herein to refer to the direct or indirect coupling between two objects. For example, if object A physically touches object B and object B touches object C, the objects A and C may still be considered coupled to one another-even if objects A and C do not directly physically touch each other. For instance, a first object may be coupled to a second object even though the first object is never directly in physical contact with the second object.

While the foregoing is directed to embodiments of the present disclosure, other and further embodiments of the disclosure may be devised without departing from the basic scope thereof, and the scope thereof is determined by the claims that follow.

What is claimed is:

1. A method of cleaning a substrate, comprising:
rotating a substrate disposed on a substrate support, wherein the substrate is supported on a back surface of the substrate;

supplying a front surface of the substrate with a cleaning agent through a front side nozzle assembly, the front surface disposed opposite the back surface, wherein the cleaning agent comprises one or more chelating agents; and supplying the back surface of the substrate with the cleaning agent from a back side dispenser assembly while the back surface of the substrate is supported on the substrate support.

2. The method of claim 1, wherein supplying the front surface of the substrate comprises applying droplets of the cleaning agent from above the substrate support, the droplets being 50 micrometers or less.

3. The method of claim 1, wherein the one or more chelating agents include tris(2-hydroxyethyl)methylammonium hydroxide, 2-dimethylaminoethanol, 2-(2-aminoethyl-amino)ethanol, or a combination thereof.

4. The method of claim 3, wherein the cleaning agent further comprises an organic solvent.

5. The method of claim 4, wherein the organic solvent includes dimethyl sulfoxide, dimethylacetamide, n-methyl-2-pyrrolidone, butyldiglycol, or a combination thereof.

6. The method of claim 4, wherein the cleaning agent further comprises water.

7. The method of claim 1, wherein supplying the back surface of the substrate comprises supplying the cleaning agent through a center opening of a back plate disposed below the substrate.

8. The method of claim 1, wherein the cleaning agent further comprises an organic alkaline.

9. The method of claim 1, wherein supplying the back surface of the substrate comprises supplying the cleaning agent through a plurality of apertures of a back plate.

10. The method of claim 1, further comprising applying megasonic energy to the substrate, wherein one or more transducers are disposed within a back plate.

11. The method of claim 1, wherein dispensing the cleaning agent comprises dispensing the cleaning agent at a rinse flow rate of about 800 ml/min to about 2000 ml/min.

12. The method of claim 1, further comprising drying the substrate by dispensing isopropyl alcohol.

13. A method of cleaning a substrate, comprising:
rotating a substrate disposed on a substrate support, wherein the substrate support supports the substrate from a back surface of the substrate;
supplying a front surface of the substrate with a cleaning agent comprising one or more chelating agents through a front side nozzle assembly disposed above the substrate support, the front surface disposed opposite the back surface; and
supplying the back surface of the substrate with the cleaning agent through a back side dispenser assembly disposed below the substrate support while the back surface of the substate is supported on the substrate support.

14. The method of claim 13, wherein the cleaning agent further comprises an organic solvent, an organic alkaline, and water.

15. The method of claim 1, further comprising activating the one or more chelating agents with water.

16. The method of claim 1, wherein the back side dispenser assembly applies megasonic energy to the cleaning agent before the supplying the back surface of the substrate.

17. The method of claim 1, wherein each of the one or more chelating agents exists in a range of about 0.001% to about 1% by mass.

18. A method of cleaning a substrate, comprising:

rotating a substrate disposed on a substrate support, wherein the substrate is supported on a back surface of the substrate by the substrate support;

supplying a front surface of the substrate with a cleaning agent from a front side nozzle assembly, the cleaning agent being water based and comprising:

water;

an organic solvent;

a surfactant of about 0.001% to about 1% by mass of the cleaning agent;

a chelating agent; and an organic alkaline;

supplying the back surface of the substrate with the cleaning agent from a back side dispenser assembly while the back surface of the substrate is supported on the substrate support;

activating the chelating agent with the water; and removing metals from the substrate with the surfactant and bonding the chelating agent to the metals, wherein the metals comprise one or more of metal ions and metal particles.

19. The method of claim 18, wherein the surfactant is a nonionic surfactant.

20. The method of claim 19, wherein the surfactant is a polyoxyalkylene-based nonionic surfactant.

21. The method of claim 18, further comprising:

forming metal-ligand bonds between the cleaning agent and the metal ions disposed on the substrate.

22. The method of claim 21, wherein the chelating agent forms the metal-ligand bonds with the metal ions.

23. The method of claim 18, wherein the organic alkaline is ethanolamine and about 0.0001% to about 10% by mass of the cleaning agent.

24. The method of claim 18, further comprising:

applying megasonic energy to one or more of the cleaning agent and the substrate while supplying the substrate with the cleaning agent.

25. The method of claim 18, wherein the surfactant is an anionic surfactant.

26. The method of claim 25, wherein the anionic surfactant is a sulfonate surfactant or sulfate surfactant.

27. The method of claim 18, wherein the chelating agent is a first chelating agent, the cleaning agent further comprising a second chelating agent, the first chelating agent being a hydroxide and the second chelating agent being an ethanol.

* * * * *